United States Patent [19]
Stafford et al.

[11] Patent Number: 5,198,263
[45] Date of Patent: Mar. 30, 1993

[54] HIGH RATE CHEMICAL VAPOR DEPOSITION OF CARBON FILMS USING FLUORINATED GASES

[75] Inventors: Byron L. Stafford, Arvada; C. Edwin Tracy; David K. Benson, both of Golden; Arthur J. Nelson, Longmont, all of Colo.

[73] Assignee: United States Department of Energy, Washington, D.C.

[21] Appl. No.: 669,718

[22] Filed: Mar. 15, 1991

[51] Int. Cl.$^5$ .................. B05D 3/06; C23C 16/26
[52] U.S. Cl. .................... 427/577; 427/249; 427/122; 427/570
[58] Field of Search ............ 427/39, 38, 249, 122; 428/408

[56] References Cited

U.S. PATENT DOCUMENTS

| | | | |
|---|---|---|---|
| 3,549,847 | 12/1970 | Clark et al. | 427/228 |
| 3,924,034 | 12/1975 | Olcott | 427/228 |
| 3,925,577 | 12/1975 | Fatzer et al. | 427/249 |
| 4,504,519 | 3/1985 | Zelez | 427/39 |
| 4,649,059 | 3/1987 | Eden et al. | 427/38 |
| 4,701,317 | 10/1987 | Arakawa et al. | 423/445 |
| 4,756,964 | 7/1988 | Kincaid et al. | 428/408 |
| 4,825,049 | 4/1989 | Rickborn | 219/545 |
| 5,071,677 | 12/1991 | Patterson et al. | 427/249 |

FOREIGN PATENT DOCUMENTS

| | | |
|---|---|---|
| 61-222915 | 10/1986 | Japan . |
| 62-100729 | 5/1987 | Japan . |
| 1-201479 | 8/1989 | Japan . |
| 1-313393 | 12/1989 | Japan . |
| 2-104664 | 4/1990 | Japan . |
| 2-107596 | 4/1990 | Japan . |

OTHER PUBLICATIONS

Arthur L. Robinson, Is Diamond the New Wonder Material? Science, vol. 234, pp. 1074-1076 (Nov. 28, 1986).

F. Ishaikawa et al., Study on Hydrophobic a-C:h:F Overcoat Layer for a-Si:H Photoreceptor, Materials Research Society Symposium Proceeding, vol. 118, pp. 429-434 (1988).

Primary Examiner—Shrive Beck
Assistant Examiner—Roy V. King
Attorney, Agent, or Firm—Ken Richardson; John M. Albrecht; William R. Moser

[57] ABSTRACT

A high rate, low-temperature deposition of amorphous carbon films is produced by PE-CVD in the presence of a fluorinated or other halide gas. The deposition can be performed at less than 100° C., including ambient room temperature, with a radio frequency plasma assisted chemical vapor deposition process. With less than 6.5 atomic percent fluorine incorporated into the amorphous carbon film, the characteristics of the carbon film, including index of refraction, mass density, optical clarity, and chemical resistance are within fifteen percent (15%) of those characteristics for pure amorphous carbon films, but the deposition rates are high.

9 Claims, 2 Drawing Sheets

HIGH RATE CHEMICAL VAPOR DEPOSITION OF CARBON FILMS USING FLUORINATED GASES

CONTRACTUAL ORIGIN OF THE INVENTION

The United States Government has rights in this invention under Contract No. S-68,637 between the U.S. Department of Energy and the Solar Energy Research Institute, a Division of Midwest Research Institute.

BACKGROUND OF THE INVENTION

1. Field of the Invention

The present invention relates generally to the deposition of films and more specifically to a high-rate, low-temperature method of depositing amorphous carbon films.

2. Description of the Prior Art

Amorphous carbon with diamondlike (single) bonds, as opposed to graphite (double) bonds, has a number of beneficial properties, including hardness, low coefficients of friction, chemically inertness, strength, and transparency. A unique feature of an amorphous carbon film is that it has thermal conductivity properties among the highest of any materials, including metals, at room temperatures and above, while at the same time being an electrical insulator, or at least only a semiconductor. A semiconductive amorphous carbon film has a variable band gap of about 1.0 to 5.45 eV, which is large when compared with more traditional semiconductors, such as silicon with 1.1 eV, and gallium arsenide with 1.4 eV. In spite of such a large band gap, amorphous carbon films are being considered for use as semiconductors, because they have a rather smooth increase in velocity of current-carrying free electrons in response to electric fields.

Because of these and other properties, more and different uses for carbon films are being found for applications in tribology, electronics, mechanical systems, and even semiconductors. Such applications include, for example, wear resistant coatings for gears, protective and transparent coatings on windows and optical equipment, high-temperature electronic components, tool coatings for improved wear and hardness, and abrasives for grinding pads and wheels.

Despite a great deal of excitement generated by the myriad potential applications of carbon films, there remain several obstacles to large-scale commercial production and use. The most significant of such obstacles include high deposition temperatures, high costs, and relatively slow deposition rates. Typically, the deposition temperatures of carbon films can be in the range of 1000° to 4000° C., although lower deposition temperatures are also used. Examples of such high-temperature processes may be found in U.S. Pat. No. 3,549,847 issued to Clark et al., U.S. Pat. No. 3,924,034 issued to Olcott, U.S. Pat. No. 4,701,317 issued to Arakawa et al., and U.S. Pat. No. 4,825,049 issued to Rickborn et al. Yet deposition rates at these high temperature levels are only about 100 Å/min.

There have been several attempts to increase deposition rates of these high temperature processes. For example, the article, "Is Diamond the New Wonder Material?" Science, Vol. 234, pgs. 1074–1076, 28 Nov. 1986, reported high-temperature deposition rates as high as 10 $\mu$m/hr (micrometers per hour), or about 1600 Å/min, of polycrystalline carbon film at the Nippon Institute of Technology in Saitama, Japan, with a high-temperature, tungsten filament method using acetone as a source material.

U.S. Pat. No. 3,925,577, issued to Fatzer et al. shows a process for coating isotropic graphite with a silicon carbide layer, which is done by depositing a layer of silicon on graphite and then heating to melt the silicon into the graphite. The first step in this process includes heating the graphite to a very high temperature, e.g., 1700° C. to 2400° C., in a halogen atmosphere of chlorine or fluorine to reduce the impurities.

The article, "Study on Hydrophobic a-C:H:F Overcoat Layer for a-Si:H Photoreceptor" by F. Ishikawa et al., Materials Research Society Symposium Proceedings, Vol. 118, pgs. 429–434, 1988, disclosed an amorphous hydrogenated fluorocarbide film used to replace a hydrogenated amorphous silicon carbide (a-SiC:H) film as a passive overcoat on photoreceptors used in electrophotography to increase blurring lifetime, the deposition process of which involved plasma-enhanced chemical vapor deposition (PE-CVD) of perfluoroethane ($C_2F_6$) and hydrogen ($H_2$). However, the deposition rate and temperature described by Ishikawa, et al., were within ordinary, commonly known carbon film deposition parameters.

Some of the special problems associated with these conventional carbon film deposition methods include higher costs of production, especially in some processes due to special high-temperature furnaces and other equipment and increased power demands required to generate such heat. However, the most important limitation imposed by such high-temperature carbon film deposition processes is that the choice of substrates onto which the carbon films can be deposited is severely restricted to only materials that withstand the high temperatures. Yet, there are many ordinary, inexpensive materials, the usefulness and durability of which could be greatly enhanced by carbon films. For example, most conventional plastics melt, burn, or otherwise break down in the high temperatures utilized in such carbon film deposition processes as those described above.

Consequently, more efficient low-temperature (i.e., room temperature) carbon film deposition processes would be very beneficial, and several have been under investigation.

For example, U.S. Pat. No. 4,504,519, issued to Zelez and U.S. Pat. No. 4,756,964, issued to Kincaid et al. show such low-temperature carbon film deposition methods. However, these low-temperature processes typically have deposition rates in the range of only about 10 Å/min. Accordingly, they have been used in only special applications, such as coating plastics that can not tolerate high temperatures.

In spite of all the attempts to solve this problem over the past several years, no one has yet been able to develop a process for the deposition of amorphous carbon films that includes the cost saving features of both higher deposition rates and lower deposition temperatures. Equally as important, there is a need for a low-temperature, high deposition rate process that also preserves the original properties and molecular purities of the resulting amorphous carbon film.

SUMMARY OF THE INVENTION

Accordingly, a general object of the present invention is to provide a process for the production of amorphous carbon films, which is more efficient, faster, and less expensive than previous amorphous carbon deposition processes.

Another general object of the present invention is to provide a more controllable process for depositing amorphous carbon films to enhance commercial feasibility.

A more specific object of this invention is to provide a method of depositing carbon films at higher deposition rates.

Another more specific object of this invention is to provide a method of depositing carbon films at higher deposition rates in lower temperature ranges.

It is another specific object of the present invention to provide a process for depositing amorphous carbon films using gases containing halogen while still maintaining the effective integrity and purity of the resulting carbon films.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in the combinations particularly pointed out in the appended claims.

To achieve the foregoing and other objects and in accordance with the purpose of the present invention, as embodied and broadly described herein, the process of this invention may comprise the deposition of an amorphous carbonaceous film onto a substrate by plasma reacting a hydrocarbon gas in the presence of a fluorinated gas. A relatively high deposition rate is provided, which can be maintained at less than 100° C. or room temperature. This deposition process may be by PE-CVD, such as a radio frequency plasma assisted chemical vapor deposition (rf-CVD). The fluorinated gas allows a relatively high deposition to occur at ambient substrate temperatures, i.e., room temperature. The rate of deposition is a function of the fluorine to carbon ratio (F/C). The most advantageous range that maximized the deposition rate was found to be about 0.1 to 2.5 F/C. On a silicon substrate this deposition rate can be in the range of about 240 to 460 Å/min and on a glass substrate the deposition rate can be in the range of about 325 to 535 Å/min.

At these F/C ratios, and probably based upon the other physical parameters of deposition, such as temperature, the amorphous carbon film contains up to 6.5 atomic percent fluorine. Despite this small fluorine content, the film has chemical and physical properties that were essentially the same, as or within about 15%, of those properties for carbon films containing essentially no fluorine. Accordingly, the characteristics of the amorphous carbon film have not been unduly restricted by the deposition process, so it can be doped or otherwise treated to meet any particular application.

BRIEF DESCRIPTION OF THE DRAWINGS

The accompanying drawings, which are incorporated herein and form a part of the specification, illustrate preferred embodiments of the present invention, and, together with the description, serve, to explain the principles of the invention. In the drawings.

DETAILED DESCRIPTION OF THE PREFERRED EMBODIMENTS

In the preferred embodiment of the present invention an amorphous carbon film is deposited at ambient or room temperature and at a relatively high deposition rate by plasma-enhanced chemical vapor deposition (PE-CVD), such as radio frequency plasma assisted chemical vapor deposition (rf-CVD), in which a very small amount of fluorinated or other halogen gas is reacted with a hydrocarbon gas. While the fluorinated gas was initially added in the carbon film deposition process in an unsuccessful attempt to improve certain physio-chemical properties of the resulting amorphous carbon films, it was discovered in this invention that the addition of fluorinated gas causes a significantly higher deposition rate of amorphous carbon film, which could even be maintained at very low deposition temperatures, including ambient or room temperature. Ambient, room, or low temperature, for the purposes of this invention, is considered to be any temperature under 100° C. While the exact mechanisms are not yet understood thoroughly, it appears that the fluorine or other halogen gas allows increased deposition rates of the amorphous carbon film probably by suppressing the formation of the chemically active etching species generated in the reaction plasma.

Carbon film deposition at room temperature according to this process can be performed at deposition rates as high as 460 Å/min. on a silicon substrate and 535 Å/min. on a glass substrate, which represents as much as a 200% increase in deposition rate above those achieved on similar substrates without the fluorinated gas. Comparable room temperature carbon film deposition rates are achievable on a variety of other substrates, such as plastics. The reactants and conditions of the depositions that gave rise to these numbers will be covered in greater detail below.

Although standard PE-CVD deposition is commonly known in the industry, a brief description of the operation of such a deposition process is presented herein in accordance with the process of the present invention. There are several commercially available deposition chambers that can be used to accomplish the process of this invention, such as those marketed by Electrotech, Plasma Technology, Technics, and Glasstech Solar, Inc.

Figure 1:
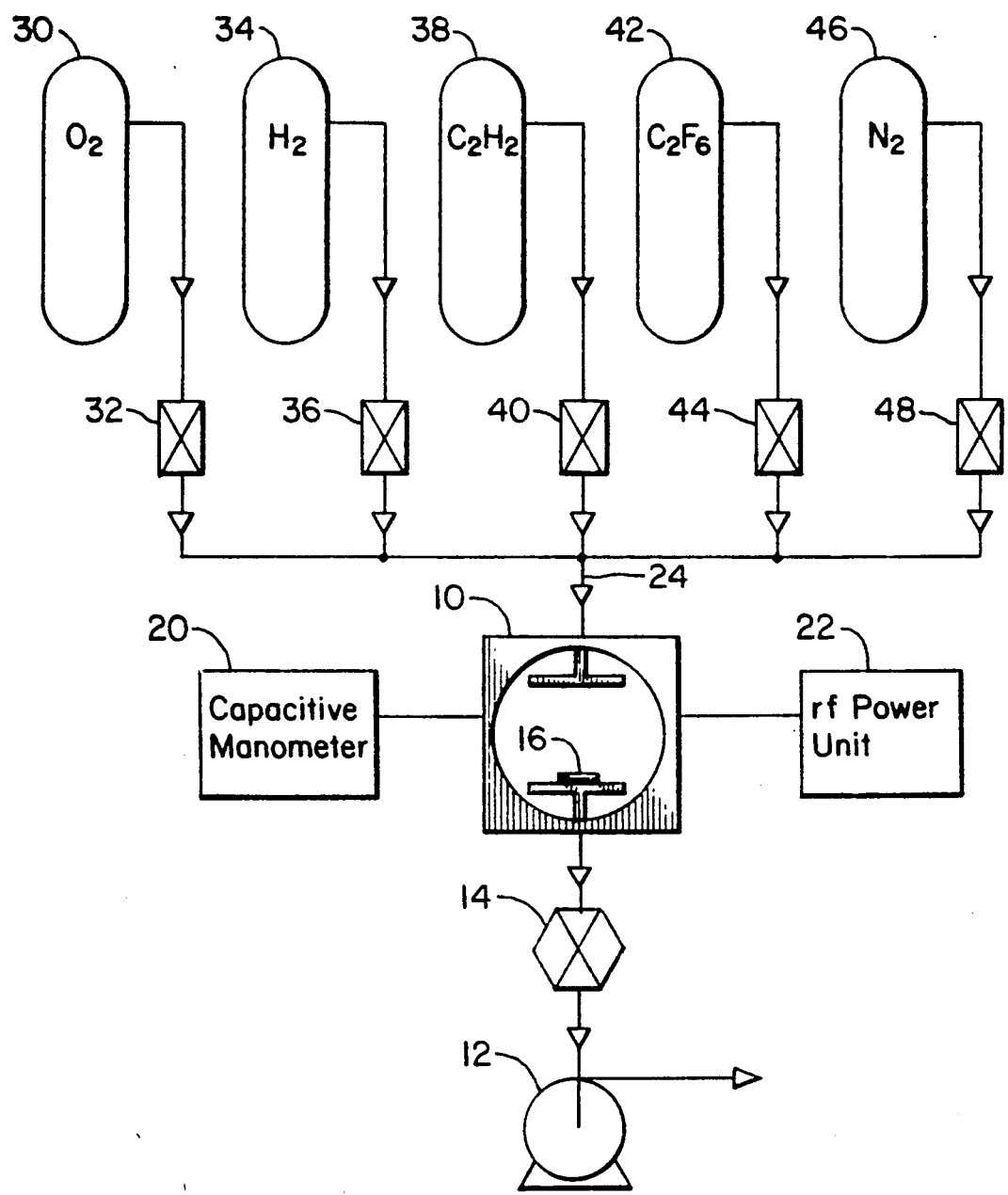
FIG. 1 is a general schematic layout of radio frequency plasma assisted chemical vapor apparatus that may be used with the preferred embodiment process of the present invention.

In operation, the preferred embodiment PE-CVD amorphous hydrocarbon deposition utilizing fluorinated gases usually begins with multiple cleanings of a substrate. A glass substrate provides an appropriate example for purposes of this description, although other substrates, such as quartz, silicon, plastic, iron, or virtually any material can be coated according to this invention because it is so effective at normal room temperatures and below. An initial precleaning can be accomplished with a mild detergent scrub and a deionized H₂O rinse. As illustrated in FIG. 1, the cleaned substrate 16 is then loaded into a standard plasma deposition chamber 10, which is evacuated to a desired system base pressure by a standard rotary vacuum pump 12. This desired system base pressure may typically be in the range of 5 to 10 mtorr (millitorr), as measured by, for example, a capacitance manometer gauge 20. Oxygen gas ($O_2$) from a storage tank 30 is then admitted into deposition chamber 10 via a common reactant flow tube 24. The flow rate of this oxygen can be controlled or metered by a mass flow controller 32. When the oxygen gas is present in chamber 10, a 100 Watt rf discharge from an rf power unit 22 is initiated for about 5 minutes at 300 millitorr to further clean the substrate.

Following this substrate cleaning, the deposition chamber is again evacuated by pump 12 to base system pressure. Reactant gases from tanks 34, 38, and 42, are then, metered into the chamber through the mass flow controllers 36, 40, and 44 respectively. These reactant gases in tanks 34, 38, and 42 may include for example, a typical hydrocarbon gas such as ethylene ($C_2H_4$), a halogen, such as fluorinated gas, or even a fluorocarbon gas, such as perfluoroethane ($C_2F_6$), and possibly even hydrogen gas ($H_2$). Vacuum pump 12 is then throttled by throttle valve 14 to attain the desired reaction pressure, which may typically be in the range of 300 to 600 mtorr.

A capacitively coupled rf-plasma discharge is then applied to chamber 10 by power unit 22, preferably at a frequency of about 13.56 MHz (megahertz), to ignite a plasma reaction of the hydrocarbon and halide gases in the chamber 10. Such a plasma reaction leads to the formation of a variety of new species including metastable atoms, free radicals, and ions. These products are chemically active and serve as precursors to the formation of new stable components. In essence, the plasma reaction releases carbon from the hydrocarbon gas. The carbon deposits on the substrate 16 along with small amounts of the halide in the form of an amorphous carbon film. This PE-plasma discharge is continued for the desired deposition period. Such deposition periods may vary from several minutes to a few hours or more, depending on the thickness of the carbon film desired and any operating restrictions based on the particular equipment used. At the end of the desired deposition period, the rf power to the plasma is turned off, and the reactant gas flow is terminated.

After deposition of the desired carbon film, chamber 10 is backfilled to atmospheric pressure with nitrogen, which may be stored, for example, in a tank 46 and metered through a mass flow controller 48. The carbon-coated substrate 16 may then be removed. Because this deposition occurs at ambient or room temperature, there is no need to cool the system or the substrate before further handling. Also, as described above, there are no additional furnaces or power requirements for heating, maintaining, or containing high temperatures that are required in other higher rate carbon deposition processes.

Presented below are several specific examples of the process of the present invention. It is to be understood that these examples are for illustrative purposes only, and are not intended to limit the scope of the invention as herein described or as set forth in the appended claims.

EXAMPLE SET 1

In an example of the preferred embodiment carbon deposition process of the present invention, the deposition reaction was performed at 300 millitorr, 20° C., and an rf power of 50 watts for 20 minutes. At these conditions, a mixture of ethylene ($C_2H_4$) and perfluoroethane ($C_2F_6$) as reactant gases was compared with a control of a reactant gas of just ethylene. In both cases the ethylene had a flow rate of 36 sccm/min, while the fluorine mixture experiment added the perfluoroethane at a rate of 3.8 sccm/min. This resulted in a total carbon flow of 72.0 sccm/min for the control and 79.6 sccm/min for the fluorine mixture. This further resulted in a hydrogen to carbon ratio (H/C) of 2.0 for the control and 1.8 for the fluorine mixture and a fluorine to carbon ratio (F/C) of 0 for the control and 0.22 for the fluorine mixture.

For both, the control mixture and the fluorine mixture described above, the respective amorphous carbon films were deposited on a silicon substrate and a glass substrate. After the 20-minute reaction time, the control resulted in 2100 Å thick amorphous carbon film on both the silicon and glass substrates, which was a deposition rate of 105 Å/min for both controls. After the 20-minute reaction time for the fluorine mixture, the silicon substrate had a 6700 Å amorphous carbon film, while the glass substrate had a 6600 Å amorphous carbon film. Therefore, the amorphous carbon deposition rate was 335 Å/min on the silicon substrate and 330 Å/min on the glass substrate. Consequently, the increase in deposition rate experienced with the fluorine mixture over the control was 219% {[(335−105)/105]*100%} on silicon and 214% on glass, for an average percent increase of 217%. These numbers are tabulated as items 10 and 11 in Table 1 on Attachment I, which is attached to this specification and made a part hereof.

EXAMPLE SET 2

Despite the impressive increase in deposition rates at room temperature in the Example Set 1 described above, it still remained to be establish whether it was the addition of the fluorine, the increase in total carbon flow, or the reduced H/C ratio that contributed to the enhanced deposition rate. Accordingly, this Example Set 2 was performed by varying only the F/C ratio, while maintaining a fixed H/C ratio and a fixed total carbon flow.

In this Example Set 2, ethylene ($C_2H_4$) and perfluoroethane ($C_2F_6$) were still used as reactant gases, along with hydrogen gas ($H_2$). Additionally, in two of the runs, a gaseous 20% perfluoroethane in ethylene solution was used in place of straight perfluoroethane.

Algebraic calculations were necessary to determine the proper mass-flow rate of each of the reactant gases in order to maintain the fixed H/C ratio and the fixed total carbon flow, while still obtaining the desired varying F/C ratios. The deposition rates were to be compared to the F/C ratios as the F/C ratio was varied from 0 to 3.0. At each mixture, where just straight perfluoroethane was used, the total flow is:

$$\text{Total Flow} = a\, H_2 + b\, C_2H_4 + c\, C_2F_6, \tag{1}$$

from which the total carbon flow is:

$$\text{Total Carbon Flow} = 2b + 2c, \tag{2}$$

the H/C ratio is $$H/C = (2a + 4b)/(2b + 2c) = (a + 2b)/(b + c), \tag{3}$$

and the F/C ratio is $$F/C = 6c/(2b + 2c) = 3c/(b + c) \tag{4}$$

Then, using a fixed H/C ratio of 3.0 and a fixed Total Carbon Flow of 60 sccm, the corresponding values of a, b, and c can be calculated. Putting the value of total carbon flow into equation 2, $$\text{Total Carbon Flow} = 2b + 2c = 60,$$

results in $$b + c = 30. \tag{5}$$

Then plugging equation 5 into equation 4, $$F/C = 3c/(b+c) = 3c/30,$$

which results in $$c = 10(F/C). \tag{6}$$

Putting equation 6 into equation 4, and solving for b gives:

$$b = 10\,[3 - (F/C)]. \tag{7}$$

Since b cannot be negative, equation 7 places an upper bound of 3.0 for the F/C ratio, given these reactants, the equations, the above mentioned fixed H/C ratio, and this fixed level of total carbon flow. Finally substituting equations 5, 7, and the fixed value of the H/C ratio into equation 3 generates:

$$H/C = 3.0 = (a + 2b)/(b+c) = \{a + 20\,[3 - (F/C)]\}/30.$$

Solving for a results in:

$$a = 10\,[3 + 2(F/C)]. \tag{8}$$

Thus, by equations 6, 7, and 8, the appropriate values for a, b, and c in sccm can be calculated for the reactants, given the various values of F/C between 0 and 3.0.

A similar algebraic method can be used to calculate the appropriate mixture flow rates when a 20% perfluoroethane in ethylene mixture is used as one of the reactant gases. Table I on Attachment I also presents the appropriate flow rates for this series of example runs, which tested various F/C ratios between 0 and 3.0.

In this set of examples, the runs were conducted at a constant pressure of 600 mtorr, a temperature of 25° C., and an rf power of 150 Watts, for 20 minutes. The results of the rf CVD plasma deposition are also presented in Table I.

Figure 2:
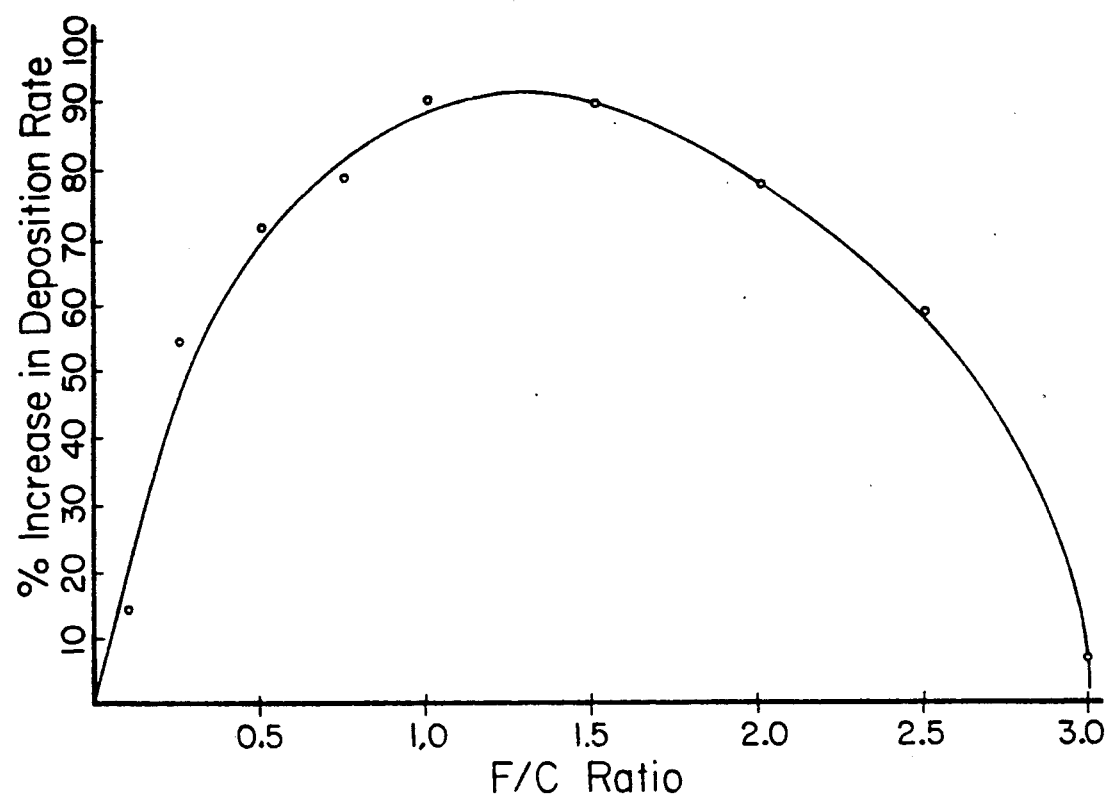
FIG. 2 is a graph showing average percent increase in deposition rate in relation to fluorine to the carbon ratio associated with the second set of examples of the process of the present invention.

As can be seen from Table I, the deposition rate of the amorphous carbon film in the presence of fluorine never dropped below 240 Å/min., and it becomes apparent that deposition rate is a function of at least the F/C ratio. FIG. 2 is a graph of this data, plotting average increase in deposition rate against the F/C ratio. As also shown by Table I and the graph in FIG. 2, there is an optimum range for F/C according to this invention that results in the greatest increases in deposition rates. For example, in the experiments where the H/C ratio was held at 3.0, 90.5% average increase in deposition rate was achieved when the F/C ratio is in the range of 1.0 to 1.5, although a substantial and significant deposition rate increase according to this invention is also obtained in the broader or extended F/C ratio range of about 0.25 to 2.5. Outside these ranges, such as F/C ratios below 0.25 and above 2.5 when H/C is 3.0, the deposition rates rapidly decrease to well-known rates for deposition of carbon films without fluorine. For example, the rate obtained using $C_2F_6$ in a F/C ratio of 3.0, similar to that used in the Ishikawa et al. reference cited above, is for practical purposes essentially no perceptible or significant increase over that for normal or conventional amorphous carbon deposition. Therefore, the addition of the fluorine was clearly responsible for the increase in the deposition rate of the carbon film, but only in ranges of F/C ratio, as described above, when the H/C ratio was held at 3.0.

The exact amount of fluorine, or F/C ratio, which is needed to maximize the deposition rate for a particular hydrocarbon reactant, is dependent on several factors. Some of these factors include type of hydrocarbon reactant; H/C ratio of reactants; total carbon content of the reactants; temperature; pressure; rf power; and type of rf discharge. Examples of types of rf discharge that may be used in accordance with the principles of the present invention include DC, AC, rf, and microwave. However, while low temperature deposition rates of amorphous carbon film can be increased significantly, according to this invention, by the addition of a halide, such as fluorine, resulting in an F/C ratio between 0.25 and 2.5, as described above, amorphous carbon film deposition rates are optimized by the addition of fluorine resulting in an F/C ratio between 1.0 and 1.5.

However, as also shown on Table I, particularly for examples 10 and 11, when the H/C ratio is lowered, for example, to 1.8, even a very low F/C ratio, such as 0.22 in example 11, results in the very impressive average deposition rate increase of 217%. Therefore, the most effective F/C ratios according to this invention are between 0.1 and 2.5. Furthermore, as shown in Table I, where the H/C ratios were lower, as in example 11, no fluorine is incorporated in the film.

As seen in Table I, the atomic percent of fluorine incorporated into the amorphous carbon film, where available, is less than 7.5% for all F/C ratios and less than 5% in the preferred ratio range. Therefore, the improvement in deposition rate is believed to be due to a change in the gas phase chemistry branching ratios, a change in the plasma's electron energy distribution, an enhancement of the surface reactions, or any combination of these causes. However, the less than 6.5 atomic percent incorporation in the preferred ratio range of fluorine does not significantly alter the physical and chemical properties of the amorphous carbon film. Such physio-chemical properties, which remain essentially unchanged to within 15%, include refractive index, mass density, optical clarity, and chemical resistance.

In the preferred embodiment this amorphous carbon film typically contains carbon, some hydrogen, and typically less than 6.5 atomic percent of fluorine, and preferably more, with little change in physio-chemical properties over just an amorphous hydrocarbon film. A significant advantage in maintaining the carbonlike integrity in the amorphous carbon film is the freedom to alter the characteristics of the film to suit particular uses, as opposed to having the characteristics of the resulting carbon film dictated by the deposition process. Thus the addition of fluorinated or other halogen gases also allows greater control over the characteristics of the carbon film produced. Such control of the process is essential for fabrication of carbon films adapted for special uses. No matter how favorable one characteristic may be for a particular use, it may be a serious drawback to other uses. For example, if the carbon film is used as an electrically conductive film for defogging the glass in car windows or solar cells, it would be desirable to have a film with a relatively high electrical conductivity. However, if the carbon film is used as a heat sink on a tightly packed integrated circuit chip, the film would have to be an electrical insulator.

There are several classes of carbon films, including crystalline diamond films (both epitaxial and polycrystalline), amorphous diamondlike carbon (a-C), amorphous diamondlike hydrocarbons (a-C:H), and graphite. This invention is generally directed to the two amorphous diamondlike films. They are called diamondlike, because the exact nature of their chemical structure is uncertain. However, numerous properties tend to indicate that there are more single or diamondlike bonds than double or graphitelike bonds. Much of the details of how, why, and even if these amorphous carbon films are incorporating the single $sp^3$, diamondlike bonds as opposed to the double $sp^2$, graphitelike, bonds, as described above, is not well understood. Accordingly, although primarily referred to throughout this specification as simply an amorphous carbon film, because of the general uncertainty in this field, it is intended that this invention includes these "diamondlike" amorphous carbon films. Also, any reference to just a carbon film in accordance with this invention is not intended to exclude a diamondlike lattice or to be any qualitative or quantitative measure of the single diamondlike bonds to the double graphitelike bonds.

In addition to the ethylene ($C_2H_4$) hydrocarbon gas used in the above examples, other hydrocarbons, such as methane, propane, pentane, hexane, and even benzene can be substituted in the process of this invention to produce the amorphous carbon film. Similarly, in addition to perfluoroethane ($C_2F_6$) described in the above examples, other fluorine additives can also be used, such as, HF, $F_2$, $CF_4$, $CHF_3$, or $C_2H_2F_2$. Other halides, such as chlorine, can also be used. However, because of the toxic and corrosive nature of HF, $F_2$, and $Cl_2$, use of them in the process of the present invention could be dangerous and expensive. It is, therefore, preferred that the fluorine gas be an inert, easily handled, noncorrosive reactant, which may even be from the Freon ® (registered trademark of DuPont) or chlorofluorocarbon family. Examples of some Freon ® gases include Freon 11 ($CCl_3F$), Freon 12 ($CCl_2F_2$), Freon 13 ($CClF_3$), Freon 21 ($CHCl_2F$), and Freon 22 ($CHClF_2$).

The amorphous carbon film adheres well to many types of substrates, including for example glasses, metals, semiconductors, and plastics. Specific examples of some of the plastic polymers that may serve as substrates include polycarbonates, polyethylenes, polypropylenes, polybutylenes, polystryrenes, polyurethanes, polyvinylchlorides, polyesters, polybutadienes, polyamides, and polyimides, just to name a few.

Because the amorphous carbon films deposited in the presence of fluorine are transparent, they also have a great many uses as transparent coatings. For example, they may be used as protective coatings on infrared optic elements, as well as protective or hermetic coatings over softer, more easily scratched coatings, such as window panes and automotive windshields. Because of the great hardness of amorphous carbon, amorphous carbon films can also serve as protective coatings on glass for military and commercial applications. For example, hard, transparent amorphous carbon films are already used on M-1 tank windows.

The amorphous carbon films produced in accordance with the present invention can also include tribological applications, such as wear resistant coatings on bearings and gears as well as other sliding applications. The hardness of these carbon films, coupled with a characteristic low coefficient of friction, make them suitable for other tribological uses, including protective or hermetic wear resistant coatings, for example, on magnetic or optical disks and xerographic drums.

Further, because these carbon films produced according to the present invention have the capability of use as everything from an electrical conductor to an electrical insulator, including semiconductors, there exist numerous electrical and electronic applications. As indicated above, carbon films may someday be used to construct semiconductors for special purposes where the features of smooth response and great thermal conductivity can play key roles, such as power amplifiers. Additional electrical applications include electrically conductive films for defogging windows and windshields, or for use in solar cells.

Additionally, because of the thermal conduction properties, these amorphous carbon films can also be used as heat sinks in association with electronic components, such as high-temperature capacitors, and high temperature integrated circuits. Such electronic components are used commonly in automobile engines, aircraft engines, and space vehicles.

Because of the hardness and density, these amorphous carbon films generated in the presence of fluorinated gases according to this low-temperature process of this invention can be used as tool coatings. For example, they would improve the hardness of drill bits and other cutting tools.

Finally, because of the abrasive nature of carbon particles formed from these amorphous carbon films, they could find utilization as abrasives. For example, they can be crushed and used for grinding grit, grinding pads, and grinding wheels.

Accordingly, a product and process for the deposition of amorphous carbon films according to this invention have been provided with significantly improved deposition rates, even at ambient and lower temperatures. The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalence may be resorted to falling within the scope of the invention as defined by the claims that follow.

TABLE 1

ATTACHMENT I
Plasma Processing Conditions and Results

| Exp #17* | Flow Rate of Reactant Gases (sccm/min) | | | | Algebraic Requirements | | | Deposition Rate (Å/min) | | % Increase in Dep. Rate | | Average % Increase in Dep. Rate | Atomic % Fluorine |
|---|---|---|---|---|---|---|---|---|---|---|---|---|---|
| | $H_2$ | $C_2H_4$ | $C_2F_6$ | 20% $C_2F_6$ in $C_2H_4$ | Total Carbon Flow (sccm) | H/C Ratio | F/C Ratio | Substrate Si | Glass | Substrate Si | Glass | | |
| 17-1 | 30 | 30.0 | — | — | 60 | 3.0 | 0 | 235 | 290 | 0 | 0 | 0 | 0 |
| 17-8 | 32 | 25. | — | 5.0 | 60 | 3.0 | 0.1 | 270 | 330 | 15 | 13 | 14.0 | 0.9 |
| 17-9 | 30 | 17.9 | 0 | 12.5 | 60 | 3.0 | 0.25 | 330 | 490 | 40 | 68 | 54.0 | 1.3 |
| 17-10 | 40 | 25. | 5.0 | — | 60 | 3.0 | 0.5 | 390 | 510 | 66 | 76 | 71.5 | 2.4 |
| 17-11 | 45 | 22.5 | 7.5 | — | 60 | 3.0 | 0.75 | 415 | 525 | 77 | 81 | 79.0 | 3.9 |
| 17-2 | 50 | 20 | 10.0 | — | 60 | 3.0 | 1.0 | 460 | 535 | 96 | 85 | 90.5 | 3.8 |
| 17-6 | 60 | 15 | 15.0 | — | 60 | 3.0 | 1.5 | 460 | 535 | 96 | 85 | 90.5 | 4.4 |
| 17-3 | 70 | 10 | 20.0 | — | 60 | 3.0 | 2.0 | 452 | 490 | 92 | 66 | 79.0 | 4.0 |
| 17-7 | 80 | 5 | 25.0 | — | 60 | 3.0 | 2.5 | 400 | 435 | 70 | 50 | 60.0 | 6.5 |
| 17-4 | 90 | — | 30.0 | — | 60 | 3.0 | 3.0 | 240 | 325 | 4 | 12 | 8.0 | 7.4 |
| -10** | — | 36 | — | — | 72.0 | 2.0 | 0 | 105 | 105 | 0 | 0 | 0 | 0 |
| -11** | — | 36 | 3.8 | — | 79.6 | 1.8 | 0.22 | 335 | 330 | 219 | 214 | 217.0 | 0 | n.a. = not available
*Experiments in the #17 Series were performed with constant pressure, temperature, RF power, and deposition time, i.e., 600 mtorr, 25° C., 150 watts, for 20 minutes.
**Exps. #10 and #11 were performed at 300 mtorr, 20° C., 50 watts, for 20 minutes.

The embodiment of the invention in which an exclusive property or privilege is claimed are defined as follows:

1. A process of depositing an amorphous diamondlike carbonaceous film on a substrate, comprising the steps of:
   positioning said substrate in a chemical vapor deposition chamber;
   flowing hydrocarbon and halide gases into said chamber in respective quantities that provide a ratio of halogen species to carbon (F/C) present in a plasma in a range of about 0.1 to 2.5; and
   igniting a plasma reaction of said hydrocarbon and halide gases in said chamber to produce chemically active carbon and halogen species in said plasma in the chamber while maintaining the chamber and the substrate at ambient temperatures so as to deposit said amorphous diamondlike carbonaceous film on said substrate.

2. The process of claim 1, including the step of flowing said hydrocarbon and halide gases into said chamber in respective quantities that provide an F/C ration in the range of about 1.0 to 1.5.

3. The process of claim 1, wherein said halide gas is a perfluoroethane ($C_2F_6$).

4. The process of claim 1, wherein said halogen species is fluorine.

5. The process of claim 1, including the step of maintaining the temperature in the chamber at less than 100° C.

6. The process of claim 1, including the step of igniting said plasma reaction with a radio frequency discharge into said chamber.

7. A method of depositing an amorphous diamondlike carbonaceous film on a substrate, comprising the steps of:
   flowing a gaseous mixture comprising hydrocarbon and a halide with a ratio of halogen species to carbon (F/C) in the range of about 0.1 to 2.5 adjacent said substrate at ambient temperature; and
   igniting a plasma reaction of said hydrocarbon and halide gases adjacent said substrate at ambient temperature to produce chemically active carbon and halogen species in a plasma and allowing some of said carbon and halogen species to deposit on said substrate to form said amorphous diamondlike carbonaceous film thereof.

8. The method of claim 7, wherein said gaseous mixture comprises respective quantities of hydrocarbon and halide that provide a ratio of halogen species to carbon (F/C) in the range of about 1.0 to 1.5 in said plasma.

9. The method of claim 7, including the step of forming said amorphous diamondlike carbonaceous film with the halogen comprising less than about 7.5 atomic percent of the film.

* * * * *